United States Patent
Ausserlechner

(10) Patent No.: US 9,651,635 B2
(45) Date of Patent: May 16, 2017

(54) BIAS CIRCUIT FOR STACKED HALL DEVICES

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 378 days.

(21) Appl. No.: 14/533,692

(22) Filed: Nov. 5, 2014

(65) Prior Publication Data

US 2016/0124055 A1    May 5, 2016

(51) Int. Cl.
*G01R 33/07* (2006.01)

(52) U.S. Cl.
CPC .................. *G01R 33/075* (2013.01)

(58) Field of Classification Search
CPC .. B64G 1/366; G01R 33/0206; G01R 33/028; G01R 33/038; G01R 33/1215; G01R 15/20; G01R 15/202; G01R 15/205; G01D 5/145; G01D 5/14; G01D 5/142; G01D 5/147; G01D 5/16; G01D 5/20; G01D 5/2006; G01D 5/2013; G01D 5/202; G01D 5/2026; G01D 5/2033; G01D 5/204; G01D 5/2046; G01D 5/205
USPC ....................................... 324/251
See application file for complete search history.

(56) References Cited

U.S. PATENT DOCUMENTS

| | | | |
|---|---|---|---|
| 2007/0290682 A1* | 12/2007 | Oohira | G01R 33/07 324/251 |
| 2013/0021026 A1 | 1/2013 | Ausserlechner | |
| 2013/0127453 A1 | 5/2013 | Ausserlechner | |
| 2013/0214775 A1* | 8/2013 | Ausserlechner | H01L 43/065 324/251 |
| 2013/0342194 A1* | 12/2013 | Motz | G01R 33/07 324/251 |
| 2014/0028304 A1 | 1/2014 | Ausserlechner | |
| 2014/0084911 A1 | 3/2014 | Ausserlechner | |
| 2014/0210461 A1 | 7/2014 | Ausserlechner | |

FOREIGN PATENT DOCUMENTS

| | | |
|---|---|---|
| DE | 102011107767 | 1/2013 |
| DE | 102012212594 | 11/2013 |
| EP | 1438755 | 7/2004 |

OTHER PUBLICATIONS

Banjevic et al., *On Performance of Series Connected CMOS Vertical Hall Devices*, Proc. 26th International Conference on Microelectronics (MIEL 2008), 4 pages.

* cited by examiner

Primary Examiner — Tung X Nguyen
Assistant Examiner — Robert P Alejnikov, Jr.
(74) Attorney, Agent, or Firm — Schiff Hardin LLP

(57) ABSTRACT

Embodiments relate to stacks of Hall effect structures, in which the potential at the contacts of each Hall effect structure throughout a stack of Hall effect structures changes monotonically. An output associated with the Hall effect structure in each layer of the stack can be compared against the output of a counterpart Hall effect structure in another stack to ascertain the strength of an incident magnetic field.

14 Claims, 12 Drawing Sheets

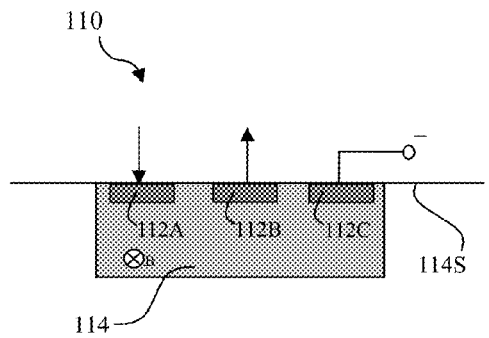
Fig. 1A (Phase 1)
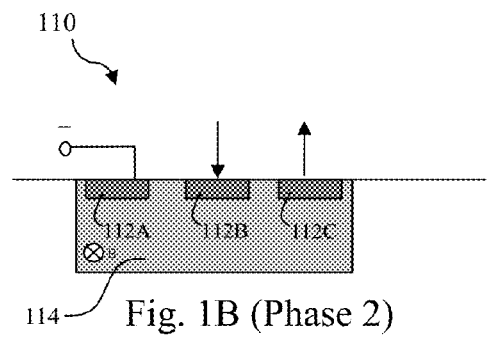
Fig. 1B (Phase 2)
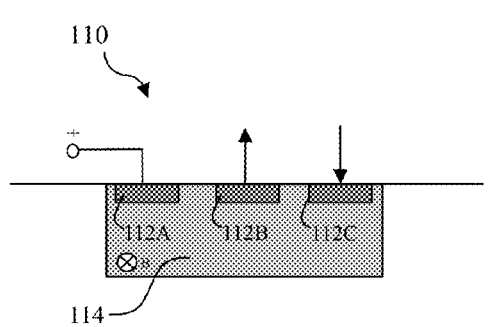
Fig. 1C (Phase 3)
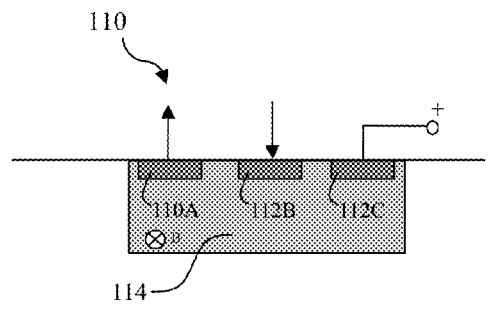
Fig. 1D (Phase 4)
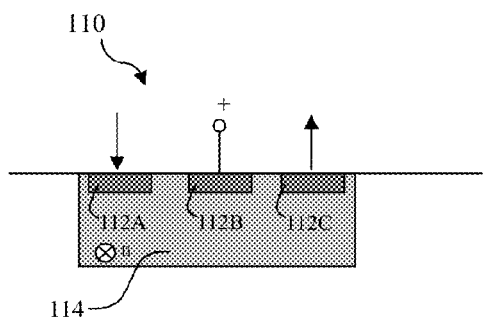
Fig. 1E (Phase 5)
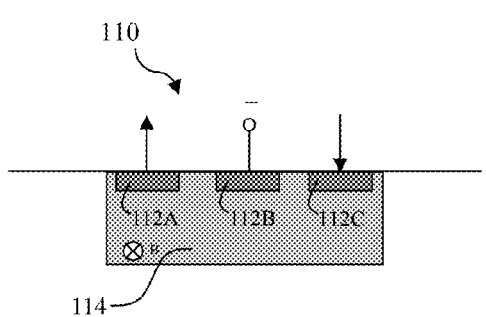
Fig. 1F (Phase 6)

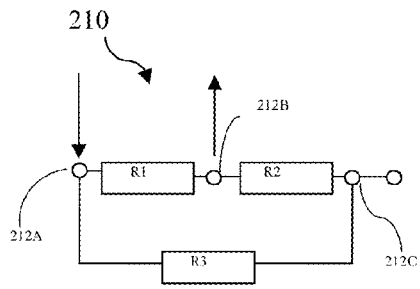
Fig. 2A (Phase 1)
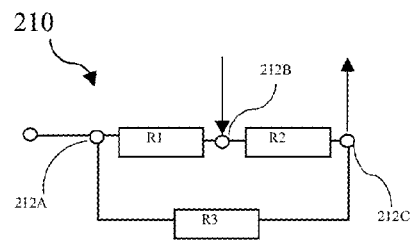
Fig. 2B (Phase 2)
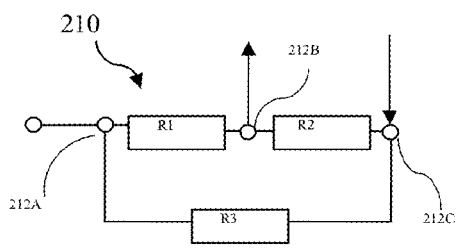
Fig. 2C (Phase 3)
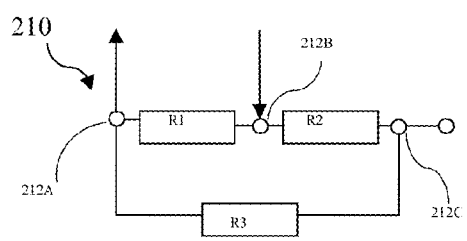
Fig. 2D (Phase 4)
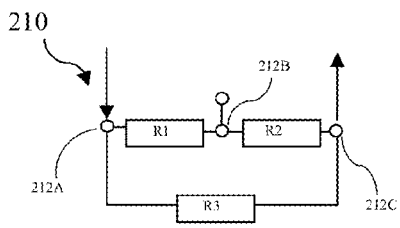
Fig. 2E (Phase 5)
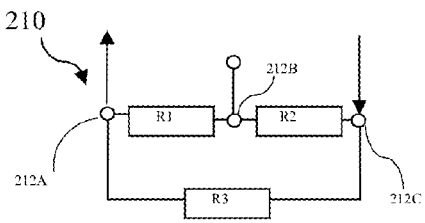
Fig. 2F (Phase 6)

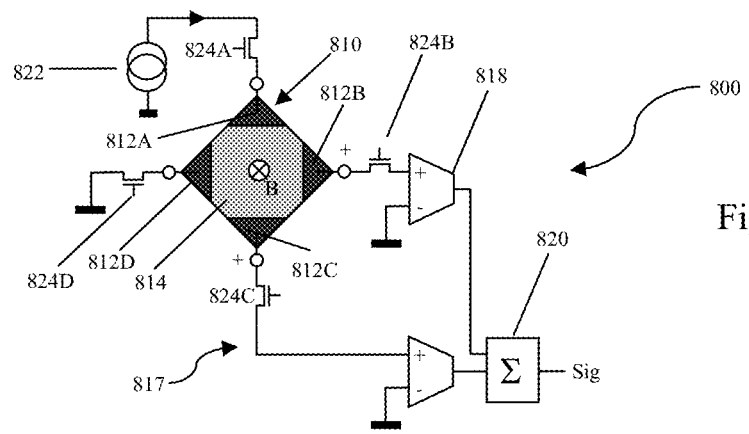
Fig. 8A (Phase 1)
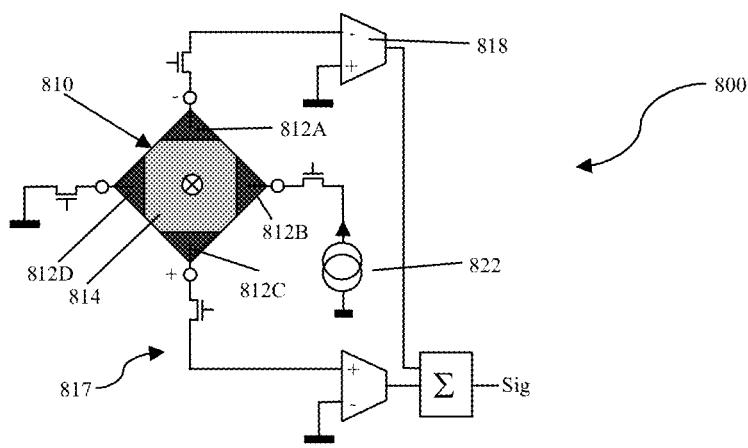
Fig. 8B (Phase 2)
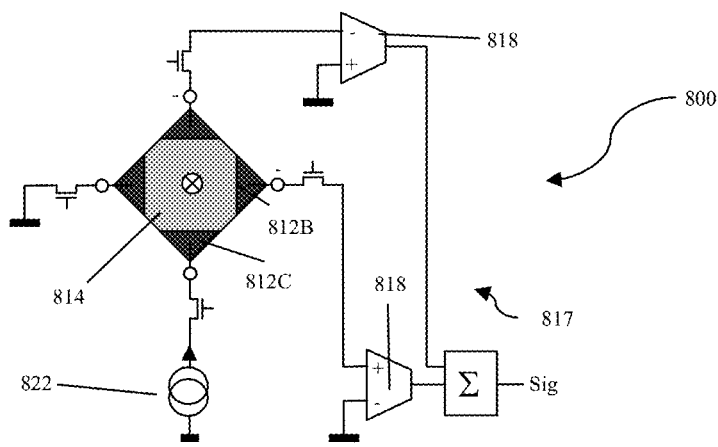
Fig. 8C (Phase 3)

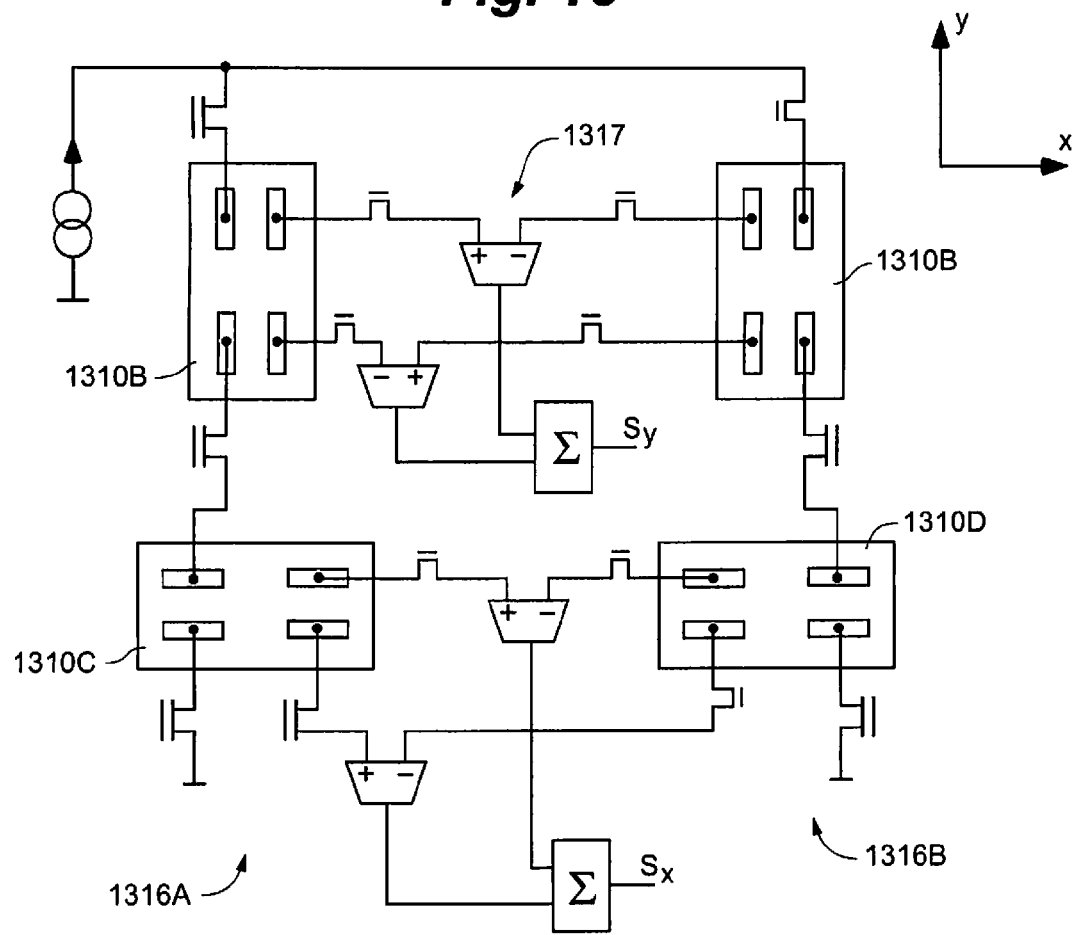

BIAS CIRCUIT FOR STACKED HALL DEVICES

TECHNICAL FIELD

Embodiments relate generally to arrangements and operating methods of Hall effect structures and sensor systems, and more particularly to interconnections of Hall effect sensor structure stacks that provide low residual offset error, low current consumption, and high magnetic field sensitivity when operated in a spinning scheme.

BACKGROUND

Hall effect sensors are used in a variety of systems to measure magnetic field. Hall effect sensors make use of the Hall effect, whereby a voltage is generated across a conductor or semiconductor due to Lorentz forces on moving charge carriers. This voltage, called the Hall voltage, can be measured to ascertain the strength of an applied magnetic field. The Hall voltage is inversely proportional to the density of charge carriers. Accordingly, Hall effect devices are often made of a semiconducting material with relatively lower charge carrier density than typical conductors.

Hall effect sensors can be either vertically or horizontally oriented in a semiconductor chip or die. Horizontal Hall effect devices, also called Hall plates, respond to a magnetic field component perpendicular to the main surface of the die in which they are formed. In contrast, vertical Hall effect devices respond to a magnetic field component parallel to the main surface of the die.

Four-contact and three-contact Hall effect devices are known. In a four-contact device, power (such as a supply current) is driven from a first contact to a second contact (usually positioned opposite the Hall effect device from the first contact along a primary axis). Third and fourth contacts are positioned to measure the Hall voltage generated by the current flow under the action of a magnetic field, and are likewise usually positioned opposite the Hall effect device from one another along a secondary axis. Third and fourth contacts are positioned such that in the absence of magnetic field they are at the same potential. This is often achieved by arranging primary and secondary axes perpendicular to one another. However, due to small inaccuracies and asymmetries in the device third and fourth contacts are usually not perfectly at the same potential at zero magnetic field. This gives a small voltage between these contacts which is called the offset error.

In a three-contact device, power (such as a supply current) is driven from a first contact to a second contact. The voltage at a third contact is a function of not only the power supplied, but also of any magnetic field incident upon the Hall effect device in a direction in which that device is sensitive. Three-contact devices can be arranged vertically (e.g., with a Hall effect region extending into the substrate in which the contacts are arranged) or horizontally (e.g., a Hall plate in which the Hall effect region is substantially coplanar with the three contacts).

The roles of the contacts (e.g., supply or signal contacts) in a three-contact vertical Hall effect device can be permuted to measure applied field in each of six distinct operating phases. This permutation is referred to as spinning Various offsets are produced during spinning operation. Within a given operating phase, at zero applied magnetic field, a signal voltage can be observed, referred to as "raw offset." By spinning the Hall effect device and combining the resultant signal voltages in the complete spinning scheme, most of the raw offset can be corrected. The remainder is referred to as "residual offset." "Electric offset" is the part of the offset that can be modeled by an equivalent resistor model of the Hall-effect device and switches. "Thermo-offset" refers to offset errors due to thermal effects such as Seebeck and Peltier effects occurring in the Hall effect device.

Generally speaking, spinning schemes for Hall effect devices attempt to produce high magnetic sensitivity, while reducing residual offset of the system. When using a spinning scheme, Hall effect devices are in general operated in an endless sequence of operating phases. This means that a spinning scheme comprising a certain number of operating phases is executed and the output signals of the Hall effect devices of these operating phases are combined; after executing the spinning scheme a first time it is repeated—perhaps intermittently and with scrambled or stochastic order—but endlessly as long as the circuit is powered on or operation is interrupted, when the circuit receives some command from external. So in a more general sense any repetitive sequence of finite operating phases, in which the Hall effect device is operated, is called a spinning scheme.

SUMMARY

Embodiments relate to a magnetic field sensor system comprising a first set of Hall effect structures configured to be interconnected as a stack, each Hall effect structure of the first set comprising two supply contacts and a signal contact; and a second set of Hall effect structures configured to be interconnected as a stack, each Hall effect structure of the second set comprising two supply contacts and a signal contact; wherein each of the Hall effect structures of the first set is configured to be interconnected as a complimentary counterpart to one of the Hall effect structures of the second set.

According to another embodiment, a method of sensing a magnetic field to generate a signal comprises arranging a first stack of Hall effect structures to measure a magnetic field component; arranging a second stack of Hall effect structures to a measure magnetic field component; and generating an output corresponding to first and second potentials at signal contacts of at least two of the first stack of Hall effect structures and a second potential at a signal contact of a complimentary counterpart Hall effect structure of the second stack.

According to another embodiment, a sensor system comprises a plurality of k>1 layers, each of the layers comprising a first Hall effect structure, a second Hall effect structure, each of the first and second Hall effect structures comprising at least three terminals. The system further includes a plurality of supply switches, wherein the supply switches are arranged to interconnect a first one of the contacts of the first Hall effect structure of the 2nd through kth layers with one of the contacts of the first Hall effect structure of an electronically adjacent layer at higher potential, and to interconnect a second one of the contacts of the first Hall effect structure of each the 1st through k−1st layers with one of the contacts of the first Hall effect structure of an electronically adjacent layer at lower potential. The supply switches are further arranged to interconnect a first one of the contacts of the second Hall effect structure of the 2nd through kth layers with one of the contacts of the second Hall effect structure of an electronically adjacent layer at higher potential and to interconnect a second one of the contacts of the second Hall effect structure of each of the 1st through k−1st layers with one of the contacts of the second Hall effect structure of an electronically adjacent layer at lower potential. The system further includes a plurality of signal switches, wherein the signal switches are configured to receive data related to at least one of the contacts of the first Hall effect structure and at least one of the contacts of the second Hall effect structure of identical layers to generate differential outputs.

BRIEF DESCRIPTION OF THE DRAWINGS

Embodiments may be more completely understood in consideration of the following detailed description, in connection with the accompanying drawings, in which:

FIGS. 1A-1F are cross-sectional views of a vertical Hall effect structure configured in six operating phases, according to an embodiment.

FIGS. 2A-2F are equivalent circuit diagrams corresponding to the operating phases of the embodiment shown in FIGS. 1A-1F, respectively.

FIGS. 8A-8C depict a four-contact Hall effect structure in each of three operating phases, according to an embodiment.

FIG. 13 is a schematic diagram of two stacks, each comprising two four-contact Hall effect structures, and circuitry connecting them.

Figure 3:
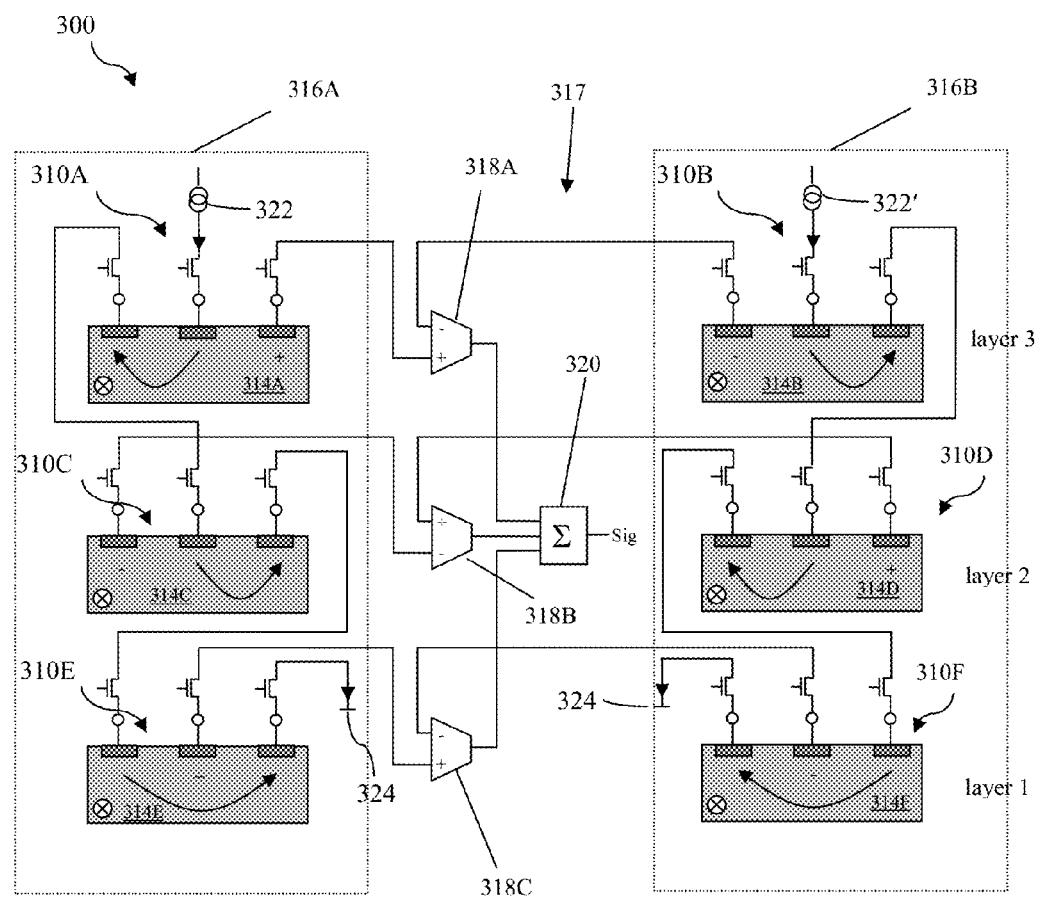
FIG. 3 is a schematic diagram of system including six three-contact vertical Hall effect structures, and corresponding circuitry, configured to generate an output signal, according to an embodiment.

While embodiments are amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to Hall effect structures and systems configured to measure a magnetic field strength. In embodiments, the Hall effect structures are arranged in stacks, and the Hall effect structures within each stack are interconnected with one another in series. In embodiments, the structures within each stack can be "spun" between various operating phases, and despite unavoidable voltage drops over switches in each stack the signals of these operating phases can be combined such that the offset error in this combination of signals is greatly reduced.

Referring to FIGS. 1A-1F, a cutaway cross-sectional view of Hall effect structure 110 is shown. Hall effect structure 110 is a vertical Hall effect structure; that is, Hall effect structure 110 measures magnetic fields in-plane with the substrate (not shown) in which it is arranged. In the orientation shown here, such field components are those directed into or out of the page, as illustrated by field component B. Hall effect structure 110 includes contacts 112A-112C positioned in Hall effect region 114 along a top surface 114S.

In FIG. 1A, Hall effect structure 110 is shown in a first operational phase. The operational phase of Hall effect structure 110 is determined by the relative positions of supply and signal contacts. As depicted by the arrows (i.e., pointing into contact 112A and out of contact 112B), contacts 112A and 112B are supply contacts in the first operational phase. That is, current is driven through Hall effect region 114 via contacts 112A and 112B. This can be accomplished by providing a current source at contact 112A and a drain at contact 112B, or it can be accomplished by providing a voltage differential across contacts 112A and 112B, for example.

For ease of description throughout the following paragraphs, directional notation will be used to refer to positions and orientations of the components of the Hall effect structure 110 and currents and fields therein. It should be understood that these references to directions are for convenience, and are not intended to be limiting. Various alternative directions, reference frames, and/or orientations could be used without departing from the scope of the described structures and embodiments.

With respect to the embodiment shown in FIG. 1A, contact 112C is a signal contact, as shown by the node extending from contact 112C. That is, there is not a substantial source of power driving current to or from signal contact 112C. The voltage present at signal contact 112C in the embodiment shown in FIG. 1A is a function of the magnetic field B. Using the orientation shown in FIG. 1A, magnetic field B has a direction facing into the page.

The magnitude of the Lorentz forces, and thus the potential throughout Hall effect region 114, is modified by the strength and direction of magnetic field B. Thus, for a magnetic field B having the direction shown in FIG. 1A, a higher field strength would cause a higher voltage at signal contact 112C. Conversely, a reduction in field strength, or a change in direction of magnetic field B from the orientation shown with respect to FIG. 1A, would cause a decrease in voltage at signal contact 112C.

By introducing an electrical power supply at supply contacts 112A and 112B and measuring the voltage at signal contact 112C, a voltage corresponding to magnetic field B can be obtained. the strength of magnetic field B can be ascertained directly from the output voltage. In practice, there are often various types of offsets within any given Hall effect structure that reduce the reliability of this type of measurement.

FIGS. 1B-1F illustrate the same Hall effect structure 110 previously described with respect to FIG. 1A. In FIGS. 1B-1F, however, the functions of the contacts 112A-112C are rearranged into five additional operating phases. In each phase, the voltage at the signal contact is affected by the strength of magnetic field B.

In the operating phase shown in FIG. 1B, electrical supply is provided from supply contact 112B to Hall effect region 114, and exits at supply contact 112C. Electrical potential can be measured at signal contact 112A to provide a signal indicative of the strength of magnetic field B.

In the operating phase shown in FIG. 1C, electrical supply is provided from supply contact 112C to Hall effect region 114, and exits at supply contact 112B. Electrical potential can be measured at signal contact 112A to provide a signal indicative of the strength of magnetic field B.

In the operating phase shown in FIG. 1D, electrical supply is provided from supply contact 112B to Hall effect region 114, and exits at supply contact 112A. Electrical potential can be measured at signal contact 112C to provide a signal indicative of the strength of magnetic field B.

In the operating phase shown in FIG. 1E, electrical supply is provided from supply contact 112A to Hall effect region 114, and exits at supply contact 112C. Electrical potential can be measured at signal contact 112B to provide a signal indicative of the strength of magnetic field B.

In the operating phase shown in FIG. 1F, electrical supply is provided from supply contact 112C to Hall effect region 114, and exits at supply contact 112A. Electrical potential can be measured at signal contact 112B to provide a signal indicative of the strength of magnetic field B.

Orthogonal phases are those phases in which the electric offsets cancel out if the outputs of sensors in those two phases are combined, such that in theory signal based only upon the magnetic field remains. For the three-contact, vertical Hall effect structures shown with respect to FIG. 1, only two phases need be combined in order to cancel the electric offsets. In particular, there are three complete orthogonal sets of orthogonal operating phases shown in FIGS. 1A-1F:

Orthogonal operating phase set A: Phase 1 and Phase 3;
Orthogonal operating phase set B: Phase 2 and Phase 5; and
Orthogonal operating phase set C: Phase 4 and Phase 6.

FIGS. 2A-2F are simplified schematic diagrams corresponding to the six operating phases of vertical Hall effect structure 110 shown in FIGS. 1A-1F, respectively. In particular, FIGS. 2A-2F illustrate a simplified resistance model that can be used to describe the electrical (not the thermal or magnetic) behavior of Hall effect structure 110 of FIGS. 1A-1F. Nodes 212A-212C correspond to contacts 112A-112C, respectively, of FIGS. 1A-1F. Resistances R1, R2, and R3 correspond to the resistances between nodes 212A and 212B; 212B and 212C; and 212A and 212C, respectively, through a Hall effect region (e.g., Hall effect region 114 of FIGS. 1A-1F).

If the Hall effect structure can be considered electrically linear the resistances R1, R2, R3 remain unchanged in all operating phases shown in FIGS. 2A-2F. Based upon this assumption, the voltage present at the signal contact of each phase can be calculated relative to the voltages present at the supply contacts. For the operating phase shown with respect to FIG. 2A, the voltage at zero magnetic field at signal contact 212C can be determined as a function of the voltage at supply terminal 212A by considering the system as a voltage splitter (we assume that contact 112B is at ground):

$$V_{212C} = V_{212A} \frac{R2}{R2 + R3}. \quad [1]$$

Furthermore, the voltage at supply contact 212A can be determined. The overall resistance between supply contact 212A and supply contact 212B, $R_{Thévenin}$, can be determined:

$$\frac{1}{R_{Thévenin}} = \frac{1}{R1} + \frac{1}{R2 + R3}; \quad [2]$$

$$R_{Thévenin} = \frac{R1(R2 + R3)}{R1 + R2 + R3}.$$

The voltage at supply terminal 212A, $V_{212A}$, will be the Thévenin resistance multiplied by the input current I:

$$V_{212A} = I \frac{R1(R2 + R3)}{R1 + R2 + R3}. \quad [3]$$

The output voltage at signal contact 212C can be determined by combining equations [1] and [3]:

$$V_{212C} = I \frac{R1 \times R2}{R1 + R2 + R3}$$

Note that at zero magnetic field the output voltage in phase 1 is the same as that of phase 3, its orthogonal operating phase. In other words, the raw offset voltage at signal contact 212C of FIG. 2A is the same as the raw offset voltage at signal contact 212A of FIG. 2C. Likewise, we can determine the raw offset output voltage for each orthogonal pair. In particular, for the orthogonal operating phases of Set B:

$$V_{212A}(\text{FIG. 2B}) = V_{212B}(\text{FIG. 2E}) = I \frac{R2 \times R3}{R1 + R2 + R3}.$$

And finally, for the orthogonal operating phases of Set C:

$$V_{212C}(\text{FIG. 2D}) = V_{212B}(\text{FIG. 2F}) = I \frac{R1 \times R3}{R1 + R2 + R3}.$$

As a practical matter, switches such as MOS switches can be used to assign the functions of each contact, by connecting or disconnecting each of the contacts from a power source, drain, or voltmeter. When operated in a spinning scheme, as described below, one or more switches may be present between the supply terminal for current flow out of the Hall effect structure 210 and another structure or ground. For current-driven embodiments such as those described above, the on-resistance of the switches attached to the input supply contact and the signal contact are not important, because the current is forced by the current source and tapped voltage is not affected by small resistances of switches as long as the voltmeter has a very high impedance. The supply contact that is connected to the current drain, however, can affect a voltage drop of several millivolts, depending on the current level through the supply contacts. The orthogonal sets of operating phases use the same supply terminal for current flow out of the Hall effect structure 210, however, so this voltage drop cancels out when the signals of orthogonal operating phases are compared.

FIG. 3 is a schematic of sensor system 300, which includes six Hall effect structures 310. Sensor system 300 includes first stack 316A and second stack 316B. Sensor system 300 further includes circuitry 317. Sensor system 300 also includes circuitry 317, which includes pre-amplifiers 318A-318C and summer 320. First stack 316A and second stack 316B are each connected to a current source (322, 322') and ground 324. Current sources 322 and 322' are connected to each stack 316A and 316B, respectively, and can be two distinct current sources that are nominally identical, although in some embodiments there may be slight differences between the current actually provided by each one. The schematic shows only those switches, which are "on" (i.e., conducting) in this specific combination of operating phases—there are additional switches (not shown), which are "off" (i.e., non-conducting) in FIG. 3 but may be "on" in other combinations of operating phases.

Stacks, such as the stacks 316A and 316B shown in FIG. 3, are arrangements of devices that are electronically ordered within a particular combination of operating phases that make up a spinning scheme. Within an operating phase, all the contacts of a first Hall effect structure have lower or equal potential to any of the contacts of a second Hall effect structure of that stack, and so on. A last device has contacts at potentials higher than or equal to any of the contacts of any previous device. In other words, the potential at the contacts of each device throughout a stack of Hall effect structures changes monotonically. In some embodiments, stacks can comprise sets of Hall effect structures connected in series, such that the total current flows through the first device, then through the second, and so on until finally it flows through the last device and into ground. In other embodiments small parts of the current may also flow into or out of the signal contacts such that not all devices are supplied by exactly the same current, but still the potentials along the stack vary monotonically. A stack comprises at least two Hall effect structures. Often, stacks of Hall effect structures are oriented to measure magnetic field in a common direction. However it is also possible to arrange several Hall effect devices into a stack, where some of them respond to magnetic fields in a first direction (e.g., the x-direction) and others respond to magnetic field in a second direction (e.g. the y-direction, x- and y- being parallel to the die surface). Thereby it is possible to combine all sensor outputs of a stack to give a signal indicative of magnetic field components in multiple directions. It is also possible to combine only the outputs responsive of a single field component and to combine all outputs responsive to a second field component, by implementing two summing circuits.

In the embodiment shown, each of the stacks 316A and 316B includes three of the Hall effect structures 310. First stack 316A includes top Hall effect structure 310A (operating in the fourth operating phase, as described in FIGS. 1-2), middle Hall effect structure 310C (second operating phase), and bottom Hall effect structure 310E (fifth operating phase). Second stack 316B includes top Hall effect structure 310B (second operating phase), middle Hall effect structure 310D (fourth operating phase), and bottom Hall effect structure 310F (sixth operating phase). As used herein, "top," "middle," and "bottom" refer to the position—within the electrical circuitry 317 of the stacks 316A and 316B—of the Hall effect structures. Thus, the number of the layer (shown throughout the figures as k) can be used to identify the relative electrical proximity of that particular Hall effect structure as between current source 322 and ground 324, within a particular operating phase. The Hall effect structures of each stack within a given layer are complimentary counterparts to one another, and their outputs can be compared to one another via signal processing circuitry (such as circuitry 317 as shown). Thus each layer of the embodiment comprises an even number of Hall effect structures, which are complementary in as far as half of them shows increasing output signals with increasing magnetic field while the other half of these Hall effect structures shows decreasing output signals with increasing magnetic field. The first half can be connected to the non-inverting inputs of the pre-amplifier and the second half can be connected to the inverting inputs of pre-amplifiers 318. This constitutes a differential signal path that is robust against common mode disturbances.

In FIG. 3 the voltage between outputs of complementary Hall effect structures nominally vanish in the absence of magnetic fields.

In alternative embodiments, many more Hall effect structures 310 could be included between current source 322 and ground 324, each pair coupled to a pre-amplifier 318 and the pre-amplifier coupled to the summer 320. Throughout the figures, these layers are referred to as a k value, but the Hall effect structures associated with each layer k=n can vary between operating phases. Although pre-amplifiers 318 are shown with respect to FIG. 3, in other embodiments no pre-amplifier is necessary. Inverting and non-inverting terminals could be present that are configured to send signal from the Hall effect structures 310 to a pre-amplifier or comparator or analog-to-digital converter or generally any kind of differential signal conditioning circuit.

It should be understood that the layers can include Hall effect structures of one or more stacks. For example, some embodiments include two stacks, and each layer k=1 through k=n includes one Hall effect structure from each stack. In fact, in many embodiments, outputs corresponding to the voltage at the signal contacts of Hall effect structures of various stacks can be compared with one another. In different operating phases, the first, last, and intermediate Hall effect structures of the stack can vary. For example, a Hall effect structure may be in the first layer in a first operating phase, a fourth layer in a second operating phase, and a third layer in a third operating phase. The layers refer to electrical, rather than geometric, position, and the Hall effect structures comprising any given layer within a first operating phase can be in different layers than one another in a second operating phase. The Hall effect structures 310A-310F are paired between stacks; that is, the top Hall effect structure of first stack 316A and the top Hall effect structure of second stack 316B are compared at pre-amplifier 318A.

Circuitry 317 is configured to direct the signal outputs of Hall effect structures 310 to pre-amplifiers 318, amplify the differences between various signals, and combine the output of pre-amplifiers 318 at summer 320. The output of the comparison performed at each pre-amplifier 318A-318C is routed to summer 320. Moreover the pre-amplifiers 318A-318C can also be implemented as transconductance stages, which provide an output current that is proportional to the voltage between non-inverting and inverting inputs. Such a transconductance stage can have more than two inputs. For example, it can have four inputs grouped in two pairs and its output current may then be proportional to the average of two voltages, each one applied across one of its two input pairs.

Sensor system 300 can be driven by one or more current sources that route current through the stacks 316A and 316B. As shown in FIG. 3, current sources 322 and 322' provide a constant current to the top Hall effect structure in each of the stacks 316A and 316B. Current flows from current sources 322 and 322' to each of the Hall effect structures 310 of each stack in series, to ground 324. If both stacks comprise identical devices, current into both stacks can be equal and the devices can be arranged in such an order that at zero magnetic field the nominal voltage at the inputs of the pre-amplifiers are zero. That is, the common mode potential (i.e. the nominal electric potential at vanishing magnetic field) of an output terminal of a Hall effect structure of the first stack in the k-th layer can be equal to the common mode potential of an output terminal of a Hall effect structure of the second stack in the k-th layer and this can apply for each layer.

In order to promote high magnetic sensitivity, the operating phases of the stacks 316 are complementary to one another. That is, at increasing magnetic field the output signal of the $k^{th}$ Hall effect structure 310 of the first stack 316A increases while the output signal of the $k^{th}$ Hall effect structure 310 of the second stack 316B decreases. For vertical Hall effect structures this means that the two Hall effect structures are mirror-symmetric—for Hall plates they may also be mirror symmetric, yet the mirror symmetry may also not apply. These complementary pairs promote larger magnetic sensitivity, because the signal of a mirror symmetric operating phase increases as the signal of the original operating phase decreases, and vice versa. Thus, the differential voltage measured at pre-amp 318 associated with the $k^{th}$ devices will have increased magnetic sensitivity in the presence of a homogeneous magnetic field. The number of the layer, k, corresponds to whether the device is higher or lower in the stack, where "upper" means "having higher potential" and thus lower number of layer than a corresponding "lower Hall effect structure." In alternative embodiments, the magnetic field on the stacks 316A, 316B may not be homogeneous, and the system may be designed to sense the gradient of magnetic field between a first location where the first stack is placed and a second location where the second stack is placed. In such a case the complementary Hall effect structures in the second stack are identical to the Hall effect structures in the first stack.

In alternative embodiments, the Hall effect structures 310 need not be identical to one another in size or geometry. While any two given Hall effect structures 310 that are compared to one another by a pre-amplifier 318 often have the same geometry and size, the Hall effect structures 310 of other layers in each of the stacks 316 can be any other geometry or size.

The system 300 can be operated in spinning current mode. That is, the operating phases of the various Hall effect structures 310 can be changed to measure the same magnetic field component strength in a variety of ways. As previously described, system 300 includes mirror-symmetric or complementary stacks 316A and 316B, so for simplicity only the phases of the first stack 316A are described below, and it should be understood that the corresponding phases of the second stack 316B are merely the mirror-opposite of those described with respect to the first stack 316A. For each signal measured from the bottom Hall effect structure 310E, the middle Hall effect structure 310C has to operate in at least two orthogonal phases in a complete spinning cycle. The bottom Hall effect structure 310E can operate in six different operating phases and each of them results in a different potential at its positive supply. For each potential at the positive supply of the middle Hall effect structure 310C, the top Hall effect structure 310A has to operate in at least two orthogonal phases in a complete spinning cycle, to cancel electric offset. Thus, for any stack (e.g., stack 316A of FIG. 3), the total number of operating phase combinations needed for a full spinning cycle is $6 \times 2^{n-1}$, where n is the number of layers of Hall effect structures in each stack. An example of a spinning scheme for the first stack 316A of system 300 is shown below, in which the numbers correspond to the operating phases of the respective Hall effect structure. In contrast with the static depiction shown in FIG. 3, the Hall effect structures are operated in various operating phases throughout the spinning cycle. The first line of the table means that device 310A is operated in phase 1 while device 310C is operated in phase 2 and while device 310E is operated in phase 4. Thus each line denotes a specific combination of operating phases for the individual devices and the entire table specifies how many and which combinations of operating phases are needed to cancel out the offset of the Hall effect devices—however, the sequential order of the lines is arbitrary:

TABLE 1

| Identifier of combination of operating phases | Identifier of operating phase of top Hall effect structure (310A) | Identifier of operating phase of middle Hall effect structure (310C) | Identifier of operating phase of bottom Hall effect structure (310E) |
| --- | --- | --- | --- |
| 1 | 1 | 2 | 4 |
| 2 | 1 | 2 | 6 |
| 3 | 1 | 5 | 1 |
| 4 | 1 | 5 | 3 |
| 5 | 3 | 4 | 2 |
| 6 | 3 | 4 | 5 |
| 7 | 3 | 6 | 4 |
| 8 | 3 | 6 | 6 |
| 9 | 2 | 1 | 1 |
| 10 | 2 | 1 | 3 |
| 11 | 2 | 3 | 2 |
| 12 | 2 | 3 | 5 |
| 13 | 5 | 2 | 4 |
| 14 | 5 | 2 | 6 |
| 15 | 5 | 5 | 1 |
| 16 | 5 | 5 | 3 |
| 17 | 4 | 4 | 2 |
| 18 | 4 | 4 | 5 |
| 19 | 4 | 6 | 4 |
| 20 | 4 | 6 | 6 |
| 21 | 6 | 1 | 1 |
| 22 | 6 | 1 | 3 |
| 23 | 6 | 3 | 2 |
| 24 | 6 | 3 | 5 |

According to Table 1, each Hall effect structure 310A, 310C, 310E is operated in operating phases 1, 2, 3, 4, 5, and 6. Thus the total number of operating phases for each structure is six. The entire spinning sequence of Table 1 consists of 24 lines, so the number of combinations of operating phases is 24. The individual operating phases of Hall effect structures are identified by identifiers 1, 2, 3, 4, 5, and 6, but these numbers may or may not be linked with a timely sequence. The individual combinations of operating phases in the spinning scheme are identified by identifiers 1, 2, . . . 24, however, these numbers may or may not be linked with a timely sequence.

The operating phases can be run sequentially by using a digital clock to time the operating phase changes, for example. Operating any given Hall effect structure 310 in the same operating phase for several consecutive operating phases can generate increased flicker noise. The spinning frequency has an effect on the corner frequency of the flicker noise of sensor system 300. As such, circuitry 317 can also include signal conditioning systems. These signal conditioning systems can be designed to cope with the spinning frequency associated with the clock frequency. As such, it is often desirable to "scramble" the operating phases of each Hall effect structure 310 so that it is not run in the same operating phase for any two subsequent operating phases. In table 1, the sequence is set such that at least the bottom Hall effect structure 310E operates in all six operating phases within the first six operating phases. In other embodiments the sequence can be set such that all Hall effect structures of the stack operate in all six operating phases within six consecutive operating phases.

Furthermore, because some groups of operating phases (e.g., operating phases 5 and 6) have different resistance than others (e.g., operating phases 1, 2, 3, 4), multiple Hall effect structures 310 in any given stack 316 that are adjacent to one another in series and operating in the same group of phases can cause that portion of the stack 316 to have higher or lower resistance. This can result in some Hall effect structures 310 of that stack 316 operating at an overall higher or lower electrical potential in some operating phases than in others, which in turn can cause error as there can be a significant potential jump at the device at highest potential in the stack. Such large potential jumps can be avoided by sufficient scrambling of the operating phases such that there are not stacks 316 containing large numbers of Hall effect structures 310 in the same group of phases having similar input resistances. In other words, the operating phases of Hall effect structures in a stack should be combined in such a way that the resistance of the complete stack changes as little as possible over the spinning scheme.

An example of a scrambled spinning scheme using the same operating phases as previously described with respect to Table 1 is shown below, in Table 2:

TABLE 2

| time | # of combination | Identifier of Operating Phase of Hall effect structure 310A | Identifier of Operating Phase of Hall effect structure 310C | Identifier of Operating Phase of Hall effect structure 310E |
|---|---|---|---|---|
| 1 | 1 | 1 | 2 | 4 |
| 2 | 8 | 3 | 6 | 6 |
| 3 | 9 | 2 | 1 | 1 |
| 4 | 13 | 5 | 2 | 4 |
| 5 | 17 | 4 | 4 | 2 |
| 6 | 21 | 6 | 1 | 1 |
| 7 | 2 | 1 | 2 | 6 |
| 8 | 7 | 3 | 6 | 4 |
| 9 | 10 | 2 | 1 | 3 |
| 10 | 14 | 5 | 2 | 6 |
| 11 | 18 | 4 | 4 | 5 |
| 12 | 22 | 6 | 1 | 3 |
| 13 | 3 | 1 | 5 | 1 |
| 14 | 6 | 3 | 4 | 5 |
| 15 | 11 | 2 | 3 | 2 |
| 16 | 15 | 5 | 5 | 1 |
| 17 | 19 | 4 | 6 | 4 |
| 17 | 23 | 6 | 3 | 2 |
| 18 | 4 | 1 | 5 | 3 |
| 19 | 5 | 3 | 4 | 2 |
| 20 | 12 | 2 | 3 | 5 |
| 21 | 16 | 5 | 5 | 3 |
| 22 | 20 | 4 | 6 | 6 |
| 23 | 24 | 6 | 3 | 5 |

Figure 4:
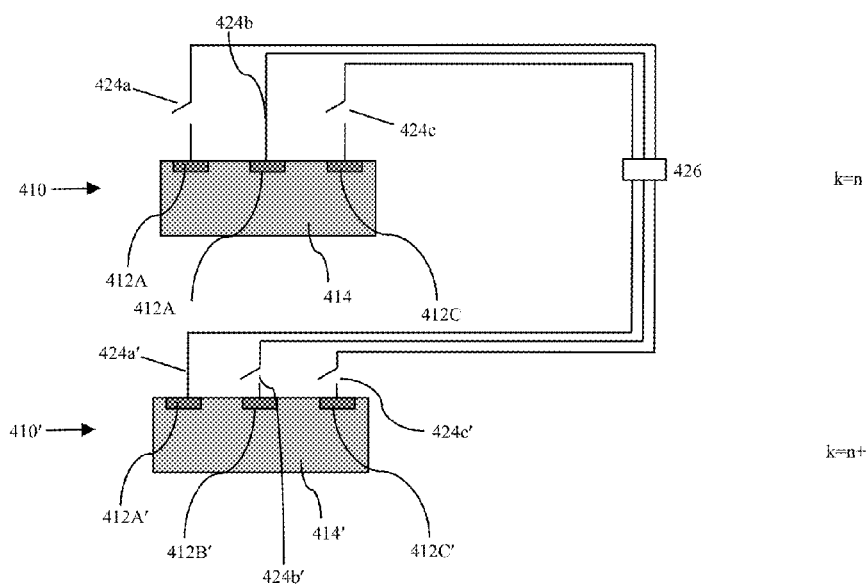
FIG. 4 is a schematic view of a supply contact switching system, according to an embodiment.

FIG. 4 is an electrical schematic depicting the connections between an upper Hall effect structure 410 and a lower Hall effect structure 410'. As previously described with respect to FIG. 3, "upper" means "having higher potential" and thus lower number of layer than a corresponding "lower Hall effect structure." FIG. 4 includes similar structures to those described with respect to previous figures, and also includes switches 424 and terminal 426, yet it also shows switches that are "off" (which were not shown in previous figures). Switches 424a-424c are connected to contacts 412A, 412B, and 412C of upper Hall effect structure 410. Likewise, switches 424a'-424c' are connected to contacts 412A', 412B', and 412C' of lower Hall effect structure 410'. The plurality of switches 424, 424' works similar to an analogue multiplexer, which connects one of several analog input signal terminals and routes them through to a fixed analog output signal terminal.

The electrical connection between upper Hall effect structure 410 and lower Hall effect structure 410' is made via terminal 426 such that for each contact 412A-412C in the upper Hall effect structure 410, there is one switch 424b activated to terminal 426, and for each contact and 412A'-412C' in the lower Hall effect structure 410', there is also one switch 424a' activated to terminal 426. As such, the connection between both devices is via two series connected switches: one switch 424b and one switch 424a'. A system (e.g., system 300) employing this switching scheme has a total of 6*n switches. This switching scheme is also shown in FIG. 3 in less detail (note that there are two activated MOS switches shown along the circuitry 317 connecting any lower Hall effect structure to the adjacent and higher Hall effect structure whereas the de-activated MOS switches are not shown in FIG. 3).

One of switches 424a-424c and one of switches 424a'-424c' will be closed in any given operating phase. By selecting which switches are open and which are closed, the various operating phases of a desired spinning scheme can be produced. FIG. 4 only illustrates the supply switches between two adjacent layers, but similar circuitry can be used to connect device 410 to an upper layer (not shown) and/or to connect each of the Hall effect structures to a pre-amp (not shown) or other circuitry.

The switches used to connect the Hall effect structures 310 can be simple NMOS-transistors or PMOS-transistors or transmission gates comprising parallel connected NMOS- and PMOS-transistors, yet even more complex switch circuits are possible (for example, comprising circuits to adjust the on-resistance according to operating conditions of the Hall effect structure 310 in order to have a better control of the potential distribution in the Hall effect structures).

In alternative interconnection schemes, it is possible to have a switch between each contact of the bottom Hall effect structure and ground, as well as a switch between each contact of the bottom Hall effect structure and each contact of the middle Hall effect structure, and so on. Such an interconnection scheme would require a system (e.g., system 300 of FIG. 3) to include 9*n−3 switches, where n is the number of Hall effect devices in each stack (e.g., stack 316A of FIG. 3). If such a switching scheme were to be used, a connection could be formed between contacts of different Hall effect structures via a single switch. Although this alternative scheme employs a larger number of switches, because no two are in series they can be smaller switches and yet still achieve the same on-resistance.

Figure 5:
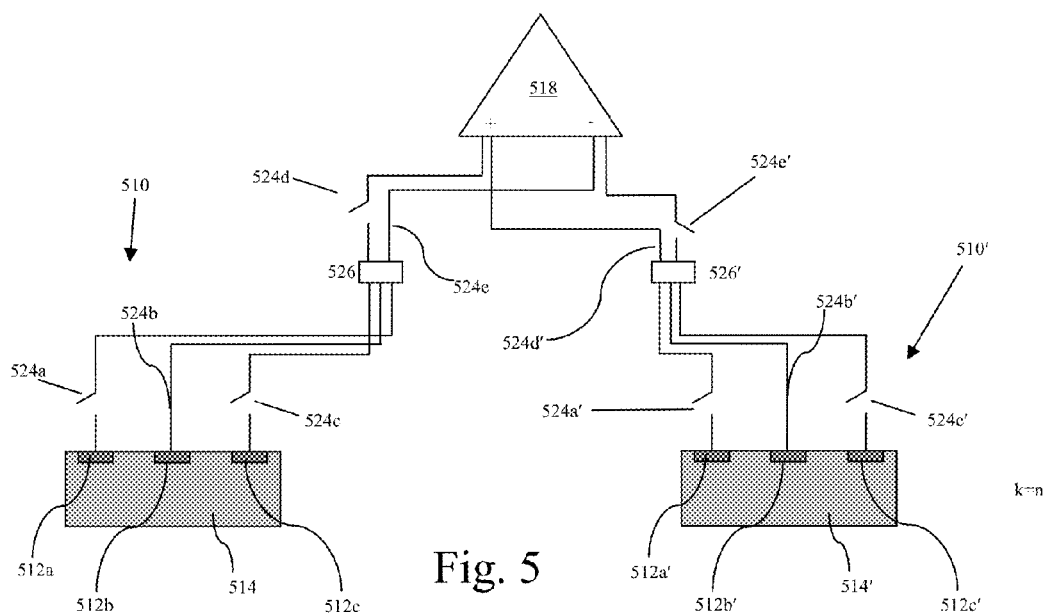
FIG. 5 is a schematic view of a signal contact switching system, according to an embodiment.

FIG. 5 is an electrical schematic diagram of Hall effect structure 510 and Hall effect structure 510', which are each in the $k^{th}$ layer but in different stacks. For example, Hall effect structure 510 and Hall effect structure 510' could be the bottom layer of the system 300 previously described with respect to FIG. 3. In the schematic diagram shown in FIG. 5, only circuitry related to signal measurement is shown. It should be understood that this circuitry could be used in conjunction with supply circuitry, such as the circuitry previously described with respect to FIG. 4.

The connection between the signal contacts of Hall effect structures 510 and 510' to preamp 518 can include a single switch, or two switches, as previously described with respect to the supply circuitry in FIG. 4. In the embodiment shown in FIG. 5, two of the switches 524a-524e can be activated to form a path between any contact (512a-512c, 512a'-512c')

of the Hall effect structures 510 and 510' and preamp 518. Each contact 512a-512c, 512a'-512c' serves as a signal contact in two of the previously-described operating phases, and the polarity of the signal is different as between those operating phases. All contacts 512a-512c, 512a'-512c' are connected to a terminal: contacts 512a-512c are connected to terminal 526 via switches 524a-512c, respectively, and contacts 512a'-512c' are connected to terminal 526' via switches 524a'-524c'. Only a single one of switches 524a-524c is closed at a time, and likewise only a single switch of the set 524a'-524c' is closed at a time. Another one of switches 524 is closed between terminal 526 and Pre-amp 518, and another one of switches 524a'-524c' is closed between terminal 526' and Pre-Amp 518. In this way, the connection to the pre-amp input with appropriate polarity can be made.

The resistance of these signal switches 524a-524c, 524a'-524c' can be within an order of magnitude of the output resistance of the associated Hall effect structure 510, 510', in order not to undesirably increase the noise associated with the circuit. The resistances of those switches that conduct the supply current (previously described with respect to FIG. 4) should be significantly lower than the input resistances of the associated Hall effect structure in order not to waste too much supply voltage across the switches 424a-424c, 424a'-424c'. Thus the current-conducting switches 424a-424c, 424a'-424c' can be about 10 times larger than the switches connecting signal contacts 524a-524c, 524a'-524c', in some embodiments.

In alternative embodiments, or even in alternative operating phases, each of the stacks can be inverted; that is, current can flow in the opposite direction as that which has previously been described with respect to FIGS. 3-5. Furthermore, in some switching schemes, the order of the individual Hall effect structures (e.g., top, middle, and bottom Hall effect structures 310 of FIG. 3) can be shuffled between clock phases by appropriate switching.

Figure 6A:
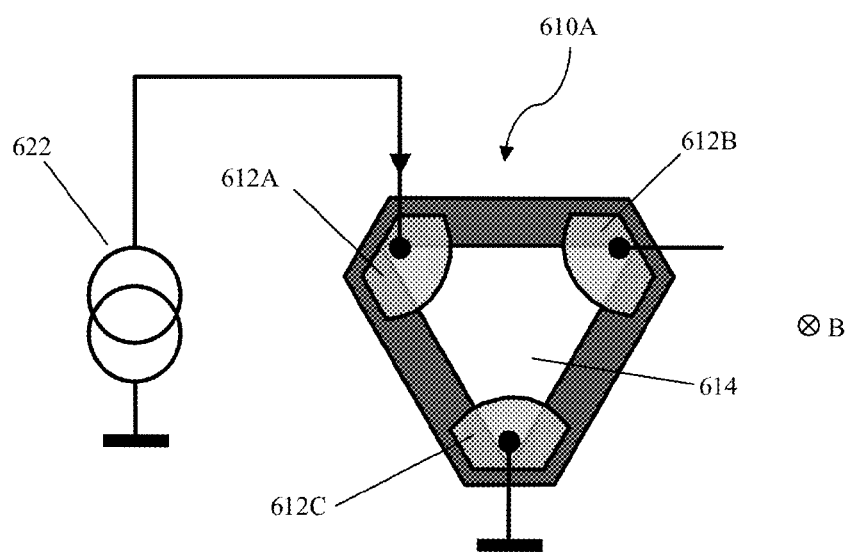
FIGS. 6A and 6B are plan views of a three contact horizontal Hall effect structure in each of two operating phases, according to an embodiment.

FIG. 6A is a plan view of a three-contact horizontal Hall effect structure 610A shown in a first operating phase. Three-contact Horizontal Hall effect structures can be used in place of the vertical Hall effect structures previously described. The typical lateral size of a horizontal Hall effect structure is between about 10 μm and about 200 μm, the thickness is between about 0.3 μm and about 7 μm, and the thickness is typically at least about 10 times smaller than the lateral size. Various operating modes of three-contact horizontal Hall effect structures are known. In spinning current operation a constant current is injected in one supply contact (shown here as contact 612A), another supply contact (shown here as contact 612C) is tied to a reference potential, and the potential at the signal contact (shown here as contact 612B) is indicative of a magnetic field passing through the horizontal Hall device, into or out of the page with respect to the orientation shown in FIG. 6A. The contacts can be permutated in order to obtain three operating phases, and the resultant signals can be added.

Figure 6B:
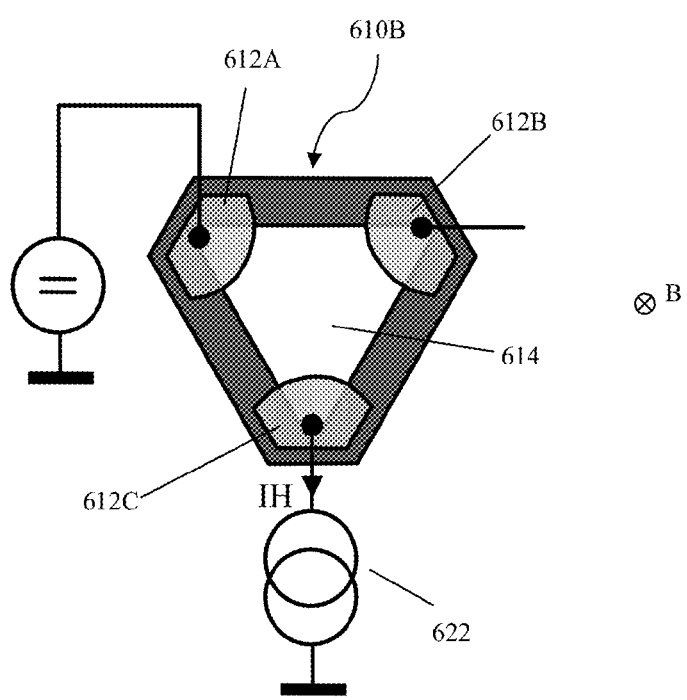

FIG. 6B illustrates an alternative way of operating the structure shown in FIG. 6A. Here, current is drawn from supply contact 612C, a constant voltage is applied at contact 612A, and signal is again measured from signal contact 612B.

Figures 7A, 7B:
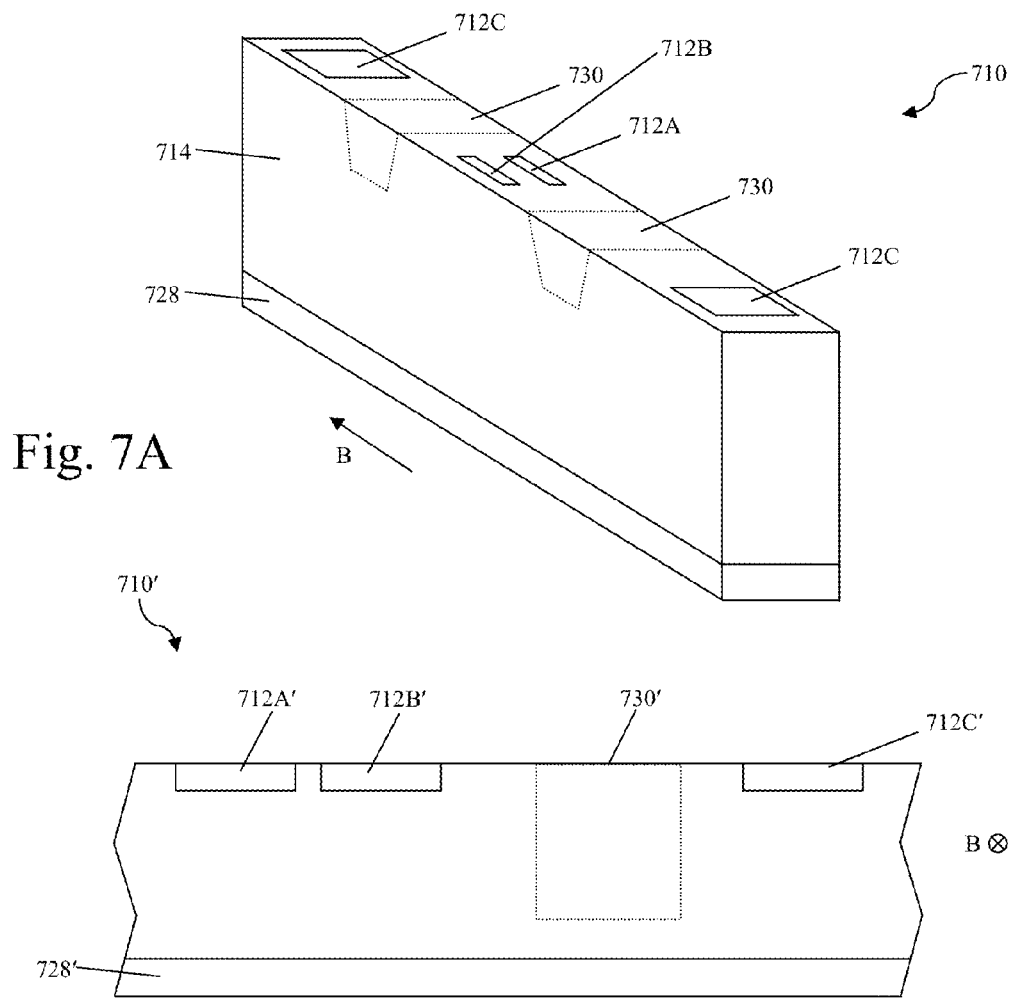
FIGS. 7A and 7B depict three-contact vertical Hall effect sensors, according to two embodiments.

FIG. 7A is a cutaway perspective view of a 3-contact vertical Hall effect structure 710. One main difference between the type of devices in FIG. 1 and FIG. 7 is that the contacts are along a straight line only in FIG. 1. Hall effect structure 710 includes many components similar to those previously described with respect to other embodiments in previous figures, and like parts are indicated by reference numerals that are iterated by factors of 100 from their counterparts in the previous figures. Unlike those previous embodiments, Hall effect structure 710 further includes an optional buried layer 728 and decoupling portions 730. Furthermore, third contact 712C is bifurcated—both parts of contact 712C can be tied together with some wire in the interconnect layer so that the overall device has only three terminals and can thus be operated as previously described with respect to FIGS. 3-5. Here the terms "buried layer" and "interconnect layer" denote physical, structural elements of a semiconductor technology, in contrast with the term "layer" used elsewhere in this application, which denotes a group of Hall effect structures of at least two stacks, where the Hall effect structures have complimentary output signals. Decoupling portions 730 prevent lateral current flow, promoting current flow to decoupling portions 730 instead. This increased current flow depth increases sensitivity to magnetic field component B. Third contact 712C is bifurcated, such that it is symmetrical about first contact 712A and second contact 712B. The two portions of third contact 712C can be coupled to one another such that they are at the same electrical potential.

FIG. 7B is a cross-sectional view of an alternative embodiment of Hall effect structure 710', which also includes an optional buried layer 728' and a decoupling portion 730'. For similar reasons to those described above with respect to Hall effect structure 710 of FIG. 7A, Hall effect structure 710' has increased magnetic field sensitivity because of the increased depth of current flow, around decoupling portion 730' and through buried layer 728'.

Figure 11:
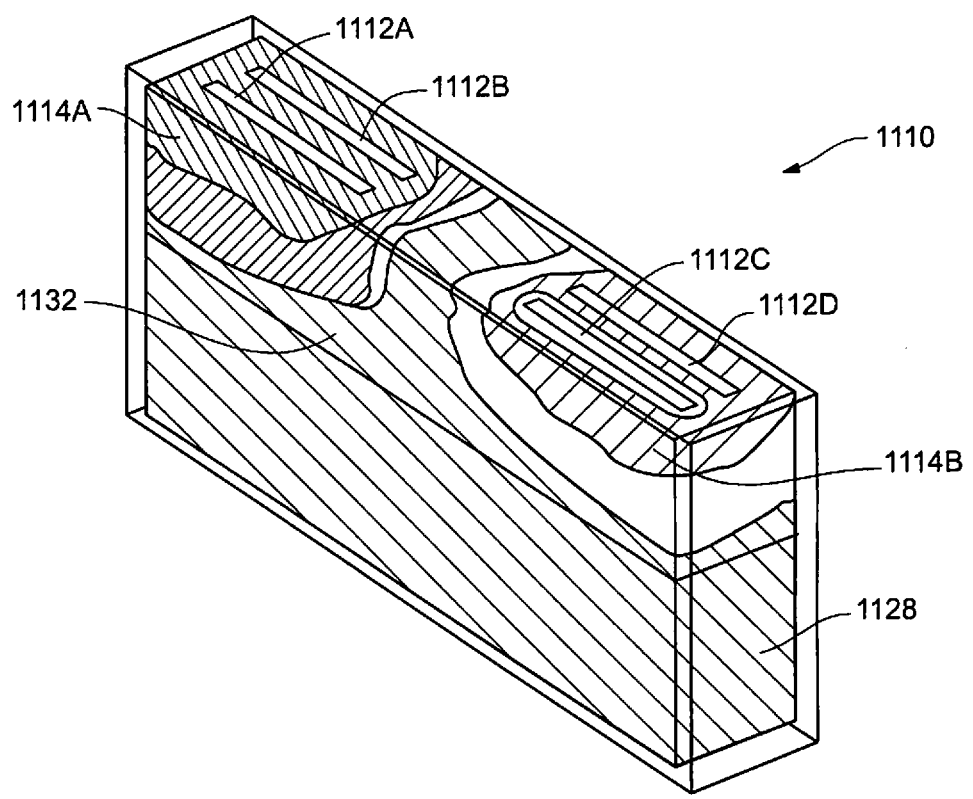
FIG. 11 is a perspective view of a four-contact vertical Hall effect structure, according to an embodiment.

FIG. 8A shows a portion of a sensor system 800. In particular, FIG. 8A shows an alternative embodiment of Hall effect structure 810, a four-contact Hall effect structure. This may be a conventional four-contact Hall plate, also called four-contact horizontal Hall effect structure, or a four-contact vertical Hall effect device as shown in FIG. 11. Four-contact horizontal Hall effect structure 810 can be used to measure magnetic field in the same direction as the three-contact horizontal Hall effect structure previously described with respect to FIGS. 6A and 6B. However, in a four-contact horizontal Hall effect structure, additional circuitry 817 can be used to obtain signal Sig related to the strength of magnetic field component B.

Because Hall effect structure 810 has four contacts, two of them can be used as supply contacts (here, contacts 812A and 812D) while two can be used as signal contacts (here, contacts 812B and 812C). The "+" next to signal contacts 812B and 812C refers to the polarity of the signal, and indicates that the potential increases with increasing magnetic field B. In order to increase sensitivity, rather than compare the potential at signal contact 812B to the potential as signal contact 812C, circuitry 817 is configured to compare each potential, independently, to a negative-polarity signal contact of some complementary Hall effect structure.

FIGS. 8B and 8C illustrate the same horizontal Hall effect structure 810 arranged in two different operating phases, in which the polarity of the output signal is modified. In the operating phase shown in FIG. 8B, there is one positive-polarity signal output and one negative-polarity signal output, whereas in FIG. 8C there are two negative-polarity signal outputs, as illustrated by the "−" signs next to the output contacts. In a first operating phase, current flows over switches 824A and 824D; in a second operating phase current flows over switches 824B and 824D; and in a third operating phase it flows over switches 824C and 824D. In each operating phase, this leads to a voltage drop over the switches 824. The voltage drop over switch 824D is present in the output signals in all phases, whereas the voltage drops over the switches connecting the current source to the Hall-effect device is irrelevant because it does not show up in the output signal. Thus, the voltage drop over switch 824D, and consequently the potential at the associated contact 812D, remains constant during all three operating phases. Thus, the voltage drop can be cancelled out by combining the output signals during these three phases accordingly. In all three operating phases there is a small contribution to the output signal as a result of the potential drop associated with switch 824D, and by combining the outputs of the three operating phases, (i) this contribution cancels out, (ii) the electrical offset of the device cancels out, and (iii) the magnetic sensitivity of the result is still large.

The potentials at the contacts 812A-812D can be computed. For example:

a. the potential at contact 812B in phase 1 (shown in FIG. 8A) is the same as the potential at contact 812A in phase 2 (shown in FIG. 8B);
b. the potential at contact 812C in phase 1 is the same as the potential at contact 812A in phase 3 (shown in FIG. 8C); and
c. the potential at contact 812C in phase 2 is the same as the potential at contact 812B in phase 3.

As an applied magnetic field directed into the page increases in field strength, the potentials at the left-hand side of the structures (with respect to the orientation shown in FIGS. 8A-8C) increase, whereas the potentials at the right-hand side of the structures decrease. Thus, these three sets shown above are orthogonal sets. Therefore a signal that is the difference between the potential at contact 812B in phase 1 and the potential at contact 812A in phase 2 has a large magnetic sensitivity and is free of electric offset. However, this signal would not be free of thermal offset. If the signal is determined as (Potential at contact 812B in phase 1)−(Potential at contact 812A in phase 2)+(Potential at contact 812C in phase 2)−(Potential at contact 812B in phase 3)

then the signal maintains a high level of magnetic sensitivity and is free from electric offset, and is also free from thermal offset related to the contact 812B, but not from the contacts 812A and 812C.

Contact 812A could be connected to ground instead of contact 812D. This provides an additional three operating phases (i.e., those in which current is injected into terminals 812B, 812C, and 812D). An additional three phases can be defined wherein ground is connected to each of contacts 812B and 812C. In total, therefore, there are twelve operating phases. By combining additional phases into a signal, as described above, further thermal offset can be accounted for. When all twelve possible phases are combined, the electrical and thermal offsets can be corrected for in their entirety.

Figure 9:
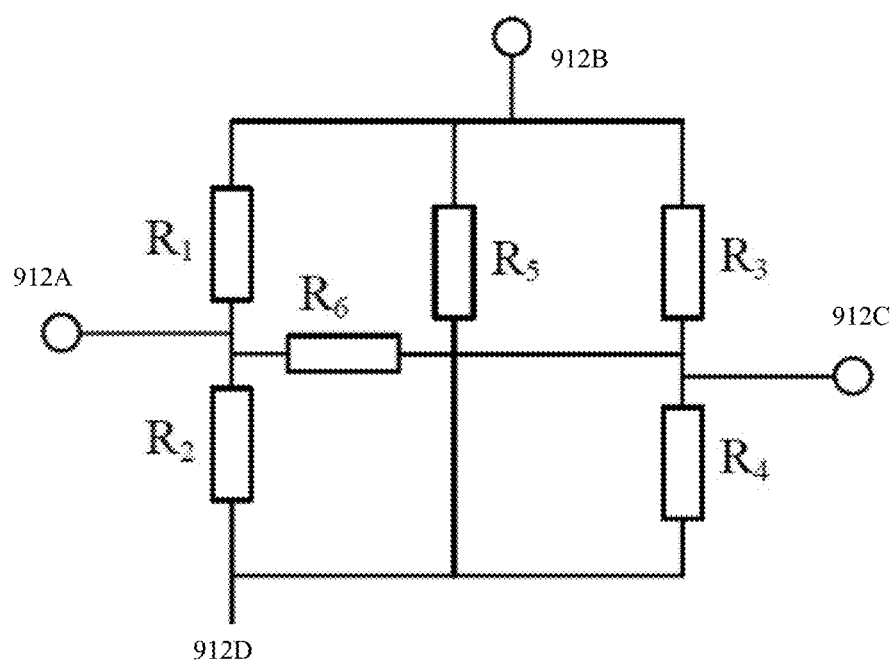
FIG. 9 is an equivalent circuit diagram corresponding to the operating phases of the four-contact Hall effect structure embodiment of FIGS. 8A-8C.

FIG. 9 is a simplified schematic diagram corresponding to a four-contact horizontal or vertical Hall effect sensor, such as, for example, the Hall effect structure 810 previously described with respect to FIGS. 8A-8C. It fully describes the electrical behavior of the device at zero magnetic field, yet not the magnetic or thermal behavior.

Figure 10:
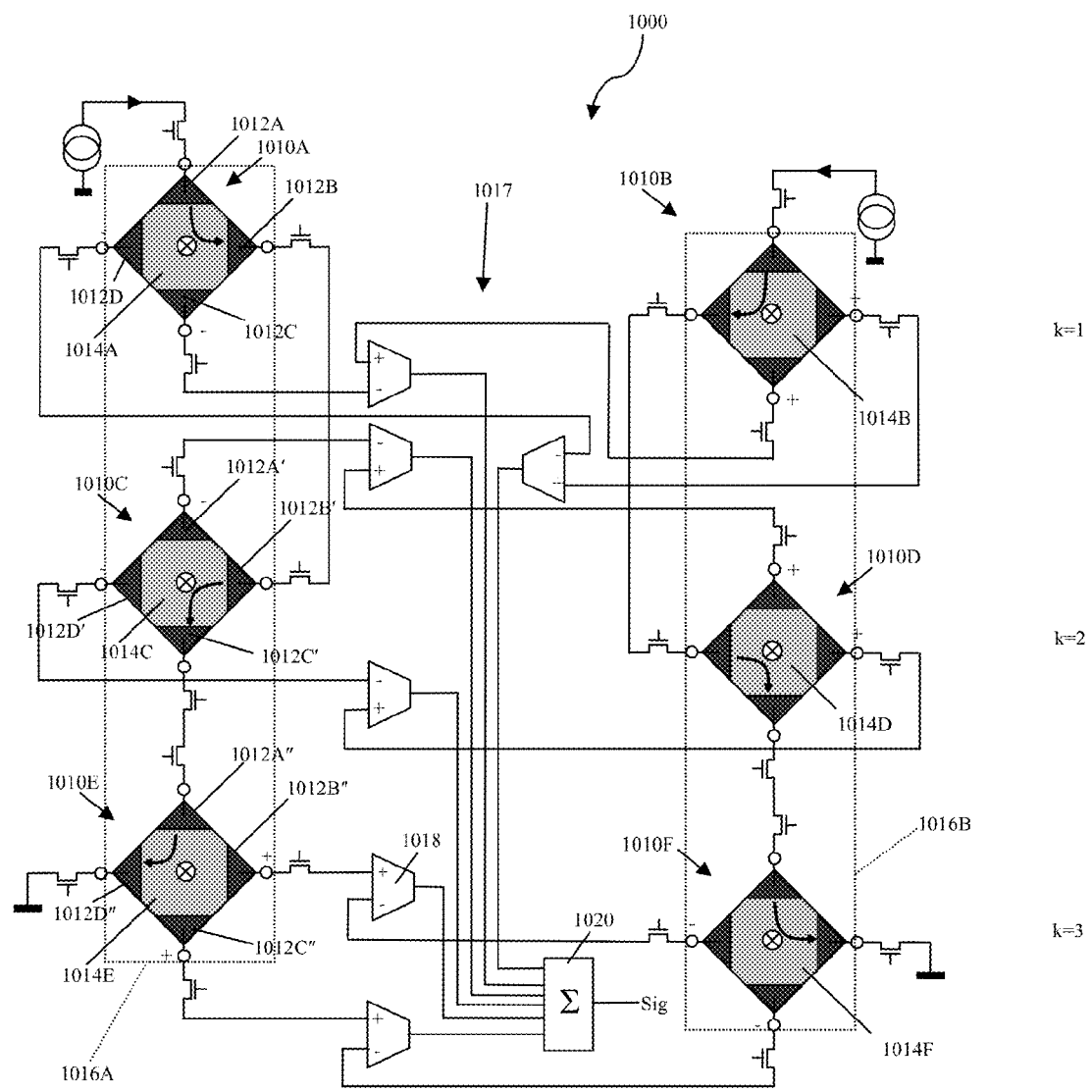
FIG. 10 is a schematic diagram of system including two stacks each of three four-contact Hall effect structures, and corresponding circuitry, configured to generate an output signal, according to an embodiment.

FIG. 10 is a schematic of sensor system 1000, which uses the potentials at the signal contacts of each of six four-contact horizontal or vertical Hall effect structures 1010A-1010F. Circuitry 1017 is configured to direct the potentials from the two signal contacts of each Hall effect structure 1010A-1010F to one of the pre-amplifiers 1018. In particular, negative-polarity outputs of the $k^{th}$ Hall effect structure 1010 in stack 1016A are compared to the positive-polarity outputs of the $k^{th}$ Hall effect structure 1010 in stack 1016B. The amplified differences between these outputs is combined at summer 1020 to produce signal Sig. For the sake of clarity FIG. 10 shows only active switches (i.e. switches which are "on" in this specific combination of operating phases of all six Hall effect structures).

FIG. 11 is a perspective view of a four-contact vertical Hall effect structure 1110 that can be used in lieu of the four-contact horizontal Hall effect structures 1010 of FIG. 10. Four-contact vertical Hall effect structure 1110 includes first Hall effect region 1114A and second Hall effect region 1114B within a common semiconductor body. Contacts 1112A-1112D are arranged in a rectangular arrangement. First Hall effect region 1114A and second Hall effect region 1114B are arranged in a common tub or well so that they are electrically isolated by a relatively large distance from the second pair of contacts 1112C and 1112D.

FIG. 11 further illustrates a block shaped Hall tub 1132 that has a rectangular main surface at which there are two pairs of contacts 1112A-1112D. The perimeter of the Hall tub 1132 is isolated against other parts of the substrate or semiconductor body for example by junction isolation or by trench isolation. The Hall tub 1132 comprises an opposite face which is a highly conductive buried layer 1128. If current flows between two of the four contacts magnetic field parallel to the long contacts 1112A-D modulates the potential on the other two of the four contacts.

Figure 12:
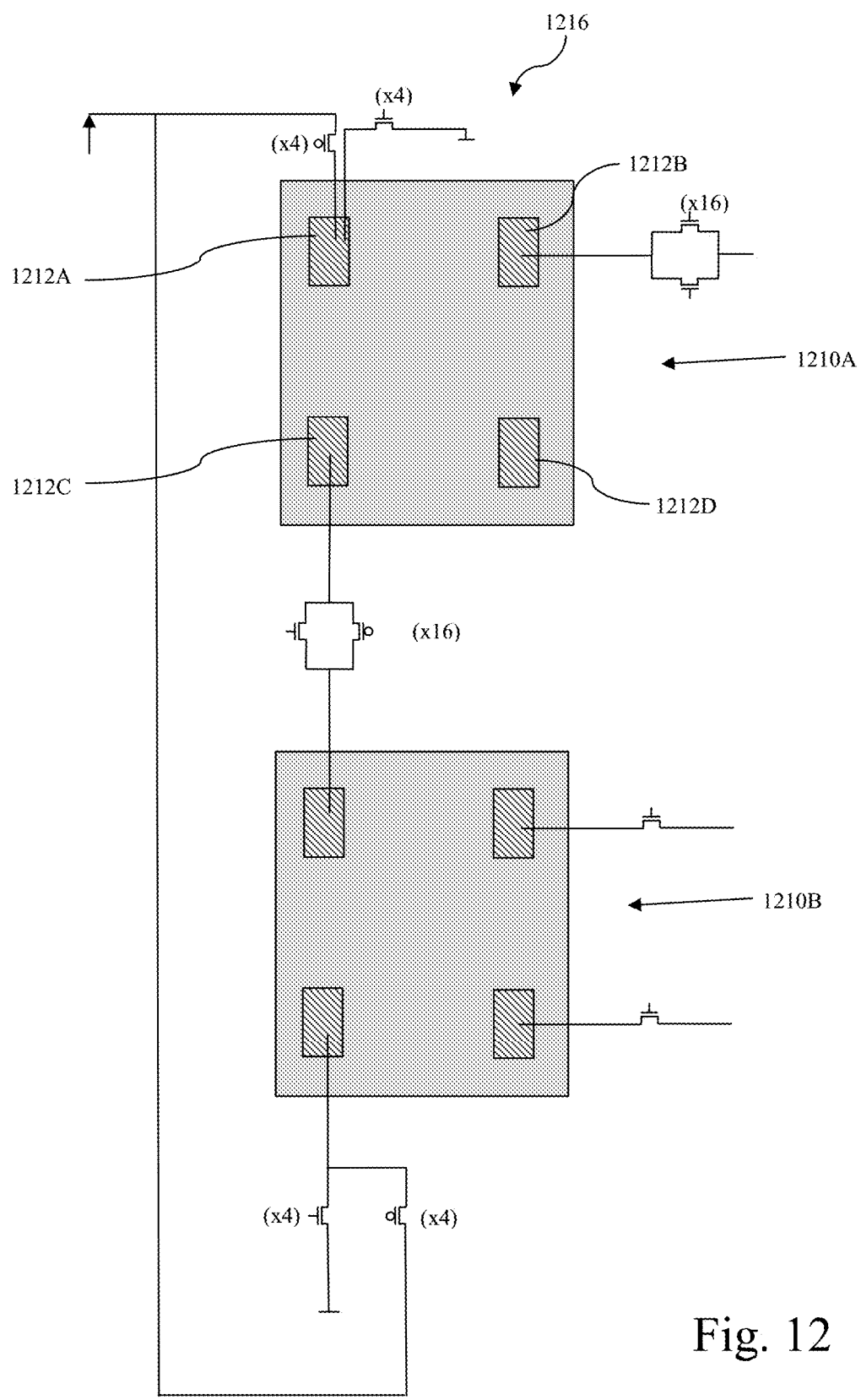
FIG. 12 is a schematic diagram of a stack of two 4-contact Hall effect structures, according to an embodiment.

FIG. 12 depicts a top view of a stack 1216 comprising two four-contact Hall effect structures, 1210A and 1210B according to FIG. 11 or according to conventional Hall plates. The first Hall effect structure 1210A, can be operated in twelve phases, as previously described. For each operating phase of Hall effect structure 1210A, Hall effect structure 1210B can operate in three operating phases that make up a complete orthogonal set, for a total of 36 operating phases per spinning cycle. Hall effect structure 1210A can be operated at a clock frequency three times that of Hall effect structure 1210B, or Hall effect structure 1210B can be operated at a clock frequency three times that of Hall effect structure 1210A, or the two Hall effect structures 1210A and 1210B can be operated at the same clock frequency as one another, in various embodiments. If all twelve operating phases of one of the Hall effect structures 1210A and 1210B are run consecutively, the offset-compensated signal can be determined after twelve operating phases, and two additional independent measurements of the offset-compensated signal can be measured within 36 operating phases (at which time the "slow" device, assuming the two Hall effect structures 1210A and 1210B operate at different clock speeds, will have completed cycling through all of the operating phases of the spinning cycle). Thus, the analog bandwidth of the system is at least a factor of twelve lower than the spinning frequency.

The number of switches between Hall effect structures 1210A and 1210B can be, for example, 16, in the case where each of the four contacts of Hall effect structure 1210A is connected via a switch to each of the four contacts of Hall effect structure 1210B. An additional eight switches are configured to selectively connect each of the contacts of each Hall effect structure (1210A, 1210B) to the current source, and another eight switches are configured to selectively connect each of the contacts of each Hall effect structure (1210A, 1210B) to ground. As shown in FIG. 12, only some switches are "on" at any given time, in order to carry out the various operating phases of the spinning cycle.

Including all the "on" switches and the "off" switches (not shown in FIG. 12), the stack 1216 of FIG. 12 would include 16+8+8=32 switches. This number of switches would also be present in a complementary stack (not shown in FIG. 12) configured to cooperate with the stack 1216 to measure a magnetic field strength. In alternative embodiments, as previously described, alternative switching systems can be used to reduce the total number of switches, and additional Hall effect sensors can be combined into a stack.

For the embodiment shown in FIG. 12, if both devices are operated with identical clock frequency, one example of a spinning cycle is shown in the table below. It should be understood that a variety of alternative spinning cycles can be performed in which the various operating phases are in different order, and that the table below is merely one example of a spinning cycle. The left-hand column shows the order in which these operating phases can be performed, according to a "scrambling" scheme as previously described. The table shows that in a first combination of operating phases labelled #1 devices 1210A and 1210B are both operated in phase 1 of FIG. 8A, in a second combination of operating phases labelled #26 device 1210A is operated in phase 1 and device 1210B is operated in phase 2, etc.

TABLE 3

| # | Operating Phase (1210A) | Operating phase (1210B) |
|---|---|---|
| 1 | 1 | 1 |
| 26 | 1 | 2 |
| 15 | 1 | 3 |
| 4 | 2 | 4 |
| 29 | 2 | 5 |
| 18 | 2 | 6 |
| 7 | 3 | 7 |
| 32 | 3 | 8 |
| 21 | 3 | 9 |
| 10 | 4 | 10 |
| 35 | 4 | 11 |
| 24 | 4 | 12 |
| 13 | 5 | 1 |
| 2 | 5 | 2 |
| 27 | 5 | 3 |
| 16 | 6 | 4 |
| 5 | 6 | 5 |
| 30 | 6 | 6 |
| 19 | 7 | 7 |
| 8 | 7 | 8 |
| 33 | 7 | 9 |
| 22 | 8 | 10 |
| 11 | 8 | 11 |
| 36 | 8 | 12 |
| 25 | 9 | 1 |
| 14 | 9 | 2 |
| 3 | 9 | 3 |
| 28 | 10 | 4 |
| 17 | 10 | 5 |
| 6 | 10 | 6 |
| 31 | 11 | 7 |
| 20 | 11 | 8 |
| 9 | 11 | 9 |
| 34 | 12 | 10 |
| 23 | 12 | 11 |
| 12 | 12 | 12 |

According to another spinning cycle, the number of switching events for supply and ground switches can be minimized, as shown in the table below.

TABLE 4

| # | Operating Phase (1210A) | Operating Phase (1210B) |
|---|---|---|
| 1 | 1 | 1 |
| 2 | 1 | 4 |
| 3 | 1 | 7 |
| 4 | 2 | 1 |
| 5 | 2 | 4 |
| 6 | 2 | 7 |
| 7 | 3 | 1 |
| 8 | 3 | 4 |
| 9 | 3 | 7 |
| 10 | 4 | 2 |
| 11 | 4 | 5 |
| 12 | 4 | 10 |
| 13 | 5 | 2 |
| 14 | 5 | 5 |
| 15 | 5 | 10 |
| 16 | 6 | 2 |
| 17 | 6 | 5 |
| 18 | 6 | 10 |
| 19 | 7 | 3 |
| 20 | 7 | 8 |
| 21 | 7 | 11 |
| 22 | 8 | 3 |
| 23 | 8 | 8 |
| 24 | 8 | 11 |
| 25 | 9 | 3 |
| 26 | 9 | 8 |
| 27 | 9 | 11 |
| 28 | 10 | 6 |
| 29 | 10 | 9 |
| 30 | 10 | 12 |
| 31 | 11 | 6 |
| 32 | 11 | 9 |
| 33 | 11 | 12 |
| 34 | 12 | 6 |
| 35 | 12 | 9 |
| 36 | 12 | 12 |

In other embodiments, the number of switching events between the devices L1 and L2 can be minimized by reversing the order of the columns in the preceding table.

FIG. 13 shows two stacks 1316A and 1316B. First stack 1316A comprises two four-contact vertical Hall effect structures (such as those shown previously in FIG. 11), 1310A and 1310C. Second stack 1316B comprises two four-contact vertical Hall effect structures 1310B and 1310D. The stacks 1316A and 1316B measure magnetic field and can be spun, as previously described with respect to FIGS. 8A-8C and 9-12. Notably, the Hall effect structures within each stack are oriented to measure magnetic field along different directions. That is, Hall effect structure 1310A extends primarily along the y axis while Hall effect structure 1310C extends primarily along the x axis, according to the arbitrary reference frame shown in FIG. 13. Thus the outputs of complimentary Hall effect structures 1310A in the first stack and 1310B in the second stack, both Hall effect structures being in the first layer, are combined to the signal Sy, which is responsive to magnetic fields in y-direction. Conversely, the output of complimentary Hall effect structures 1310C in the first stack and 1310D in the second stack, both Hall effect structures being in the second layer, are combined to the signal Sx, which is responsive to magnetic fields in x-direction. Only the active (i.e. conducting) switches are shown in the figure as NMOS-transistors, although the switches could be implemented also with other types of circuitry. In FIG. 13 both stacks are supplied by the same current source, however, they can also be supplied by different current sources as shown in FIG. 3, or even by voltage sources. The combining circuit 1317 shows OTAs (operational transconductance stages). In practice an OTA might be a simple differential input pair of transistors, biased by a current source and working onto a current mirror. However, many alternative ways to implement OTAs are known in prior art. The signals may also be combined by other circuit techniques than OTAs. In alternative embodiments, various layers of stacks can be oriented in any of a variety of different directions to measure magnetic field components in those directions.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A sensor system comprising:
    a plurality of k>1 layers, each of the layers comprising a first Hall effect structure, a second Hall effect structure, each of the first and second Hall effect structures comprising at least three terminals;
    a plurality of supply switches, wherein:
        the supply switches are arranged to interconnect a first one of the contacts of the first Hall effect structure of the 2nd through kth layers with one of the contacts of the first Hall effect structure of an electronically adjacent layer at higher potential, and to interconnect a second one of the contacts of the first Hall effect structure of each the 1st through k−1 st layers with one of the contacts of the first Hall effect structure of an electronically adjacent layer at lower potential; and
        the supply switches are arranged to interconnect a first one of the contacts of the second Hall effect structure of the 2nd through kth layers with one of the contacts of the second Hall effect structure of an electronically adjacent layer at higher potential and to interconnect a second one of the contacts of the second Hall effect structure of each of the 1st through k−1st layers with one of the contacts of the second Hall effect structure of an electronically adjacent layer at lower potential; and
    a plurality of signal switches, wherein the signal switches are configured to receive data related to at least one of the contacts of the first Hall effect structure and at least one of the contacts of the second Hall effect structure of identical layers to generate differential outputs.

2. The sensor system of claim 1, wherein the first Hall effect structures of each layer are configured to operate as a first stack, and the second Hall effect structures of each layer are configured to operate as a second stack.

3. The sensor system of claim 2, wherein the first stack and the second stack are each configured to sense magnetic field components in a first direction.

4. The sensor system of claim 2, wherein the first stack and the second stack are configured to sense magnetic field components in different directions.

5. The sensor system of claim 2, wherein the first stack and the second stack are configured to sense magnetic field components in perpendicular directions.

6. The sensor system of claim 2, wherein one of the plurality of signal switches is configured to connect a contact of a first one of the Hall effect structures of the first stack to an inverting terminal, and one of the plurality of signal switches is configured to connect a contact of a first one of the Hall effect structures of the second stack to a non-inverting terminal.

7. The sensor system of claim 6, wherein the signal switches are configured to provide signal voltages from one of the Hall effect structures of each stack to a pre-amplifier.

8. The sensor system of claim 2,
    wherein the first stack comprises k Hall effect structures each arranged in a separate layer, and
    wherein:
        a first Hall effect structure of the first stack disposed in a first layer is configured to be coupled to at least one current or voltage source; and
        a kth Hall effect structure of the first stack disposed in the kth layer is configured to be coupled to at least one current drain or reference potential.

9. The sensor system of claim 8, further comprising:
    a plurality of supply switches,
    wherein:
        for layer 1, at least one of the plurality of supply switches is arranged between a supply circuit and a supply contact of the Hall effect structure of the first stack in layer 1;
        for each layer 1 through k−1, at least one of the plurality of supply switches is arranged between a supply contact of the Hall effect structure of the first stack disposed in that layer and a supply contact of the Hall effect structure of the first stack disposed in the following layer; and for the kth layer, at least one of the plurality of supply switches is arranged between a supply contact of the Hall effect structure disposed in the kth layer and the current drain.

10. The sensor system of claim 9, wherein the supply switches are configured to be activated in a pattern such that the highest potential in each stack is substantial equal throughout the pattern.

11. The sensor system of claim 8, wherein the Hall effect structures within each layer have a substantially uniform geometry and orientation.

12. The sensor system of claim 1, wherein current flows between adjacent layers of each stack via two serially-connected switches.

13. The sensor system of claim 11, wherein each Hall effect structure of at least one layer is a 3-contact Hall effect structure.

14. The sensor system of claim 1, wherein each Hall effect structure of at least one layer is a 4-contact Hall effect structure.

* * * * *